US008773177B2

(12) United States Patent
Kikuchi et al.

(10) Patent No.: US 8,773,177 B2
(45) Date of Patent: Jul. 8, 2014

(54) DRIVE CIRCUIT

(71) Applicants: Naoto Kikuchi, Seto (JP); Kenichi Takagi, Nagoya (JP)

(72) Inventors: Naoto Kikuchi, Seto (JP); Kenichi Takagi, Nagoya (JP)

(73) Assignee: Kabushiki Kaisha Toyota Chuo Kenkyusho, Nagakute (JP)

( * ) Notice: Subject to any disclaimer, the term of this patent is extended or adjusted under 35 U.S.C. 154(b) by 0 days.

(21) Appl. No.: 13/780,780

(22) Filed: Feb. 28, 2013

(65) Prior Publication Data

US 2013/0222042 A1    Aug. 29, 2013

(30) Foreign Application Priority Data

Feb. 28, 2012  (JP) ................................. 2012-041067

(51) Int. Cl.
*H03B 1/00* (2006.01)
*H03K 3/00* (2006.01)

(52) U.S. Cl.
USPC ........................................ 327/108; 327/112

(58) Field of Classification Search
USPC ............... 327/108–112, 538–543; 326/62–67
See application file for complete search history.

(56) References Cited

U.S. PATENT DOCUMENTS

| 5,986,484 A | 11/1999 | Kimata |
| 6,566,838 B2 * | 5/2003 | Maiocchi ...................... 318/652 |
| 6,885,225 B2 * | 4/2005 | Ohmichi et al. .............. 327/112 |

FOREIGN PATENT DOCUMENTS

| JP | A-08-47170 | 2/1996 |
| JP | A-10-023743 | 1/1998 |
| JP | A-2001-352748 | 12/2001 |
| JP | A-2005-012972 | 1/2005 |
| JP | A-2009-200891 | 9/2009 |
| JP | A-2010-200560 | 9/2010 |
| JP | A-2011-130571 | 6/2011 |

OTHER PUBLICATIONS

Jan. 7, 2014 Office Action issued in Japanese Application No. 2012-041067 (with English translation).

* cited by examiner

*Primary Examiner* — Lincoln Donovan
*Assistant Examiner* — Diana J Cheng
(74) *Attorney, Agent, or Firm* — Oliff PLC

(57) ABSTRACT

A drive circuit is provided with a charge pump including a capacitor. The capacitor of the charge pump is configured to be charged in the first stage and to be connected with the gate terminal of the switching device in the second stage. The charge pump is configured to be able to adjust a charging voltage charged in the capacitor according to an order signal.

12 Claims, 7 Drawing Sheets

DRIVE CIRCUIT

CROSS-REFERENCE TO RELATED APPLICATION

This application claims priority to Japanese Patent Application No. 2012-041067 filed on Feb. 28, 2012, the contents of which are hereby incorporated by reference into the present application.

TECHNICAL FIELD

The technique disclosed in the present application relates to a drive circuit for driving a switching device.

DESCRIPTION OF RELATED ART

Switching devices are used for various purposes, and for example, are used in converters for converting DC voltages and inverter devices for converting DC (AC) voltages to AC (DC) voltages. As an example of the switching devices, a switching device having an insulated gate is known. The switching devices such as Insulated Gate Bipolar Transistors (IGBT) and Metal Oxide Semiconductor Field Effect Transistors (MOSFET) can be switched to turn ON and turn OFF by delivering and removing dynamic charges for charging and discharging a gate input capacitance of the switching device.

A drive circuit that includes a controller operating according to a PWM signal is used to drive such a main switching device. The controller of the drive circuit is configured so that the gate terminal of the main switching device is connected to a positive electrode of a DC power source in an ON-stage, and the gate terminal of the main switching device is connected to a negative electrode of the DC power source in an OFF-stage. As a result, the gate voltage rises in the ON-stage so that the main switching device is turned on, and the gate voltage falls in the OFF-stage so that the main switching device is turned off.

In the drive circuit of this type, it is desirable to accelerate the turning ON and/or OFF of the main switching device to reduce a switching loss. Japanese Patent Application Publication No. 2010-200560 discloses a drive circuit that includes a charge pump that includes a capacitor used for turning ON and a capacitor used for turning OFF in order to accelerate the turning ON and OFF of main switching devices. The charge pump is configured such that the capacitor used for turning ON is charged in the OFF-stage, and a driving voltage being higher than that of a positive electrode of a DC power source is generated using a charging voltage of the capacitor used for turning ON in the ON-stage. Due to this operation, it can be achieved to quickly deliver gate charges of the main switching device. Moreover, the charge pump is further configured such that the capacitor used for turning OFF is charged in the ON-stage, and a driving voltage being lower than that of a negative electrode of the DC power source is generated using the charging voltage of the capacitor used for turning OFF in the OFF-stage. Due to this operation, it is possible to quickly remove gate charges of the main switching device.

BRIEF SUMMARY OF INVENTION

In the technique disclosed in Japanese Patent Application Publication No, 2010-200560, the charging voltage of the capacitor of the charge pump is a fixed value. The technique disclosed in the present application aims to realize a drive circuit with high degree of freedom, having a charge pump.

The technique disclosed in the present application is implemented in a drive circuit for driving a switching device. An example of the drive circuit includes a first terminal, a second terminal, a controller, and a charge pump including a capacitor. The first terminal is configured to be connected with one of polarities of a DC power source. The second terminal is configured to be connected with another of the polarities of the DC power source. The controller is configured to connect a gate terminal of the switching device with the first terminal in a first stage, and to connect the gate terminal of the switching device with the second terminal in a second stage. The capacitor of the charge pump is configured to be charged in the first stage, and to be connected to the gate terminal of the switching device in the second stage. The charge pump is configured to be able to adjust a charging voltage charged in the capacitor according to an order signal.

In the drive circuit disclosed in the present application, the capacitor of the charge pump is charged in the first stage and is connected to the gate terminal of the switching device in the second stage. Due to this operation, it is possible to generate a driving voltage that is different from that of the DC power source using the charging voltage of the capacitor in the second stage. Further, in the drive circuit disclosed in the present application, it is possible to adjust the charging voltage for the capacitor of the charge pump according to the order signal. Due to this operation, it is also possible to independently adjust the magnitude of the driving voltage generated in the second stage. The drive circuit disclosed in the present application can flexibly control the switching device in the second stage using the order signal.

DETAILED DESCRIPTION OF INVENTION

Figure 1:
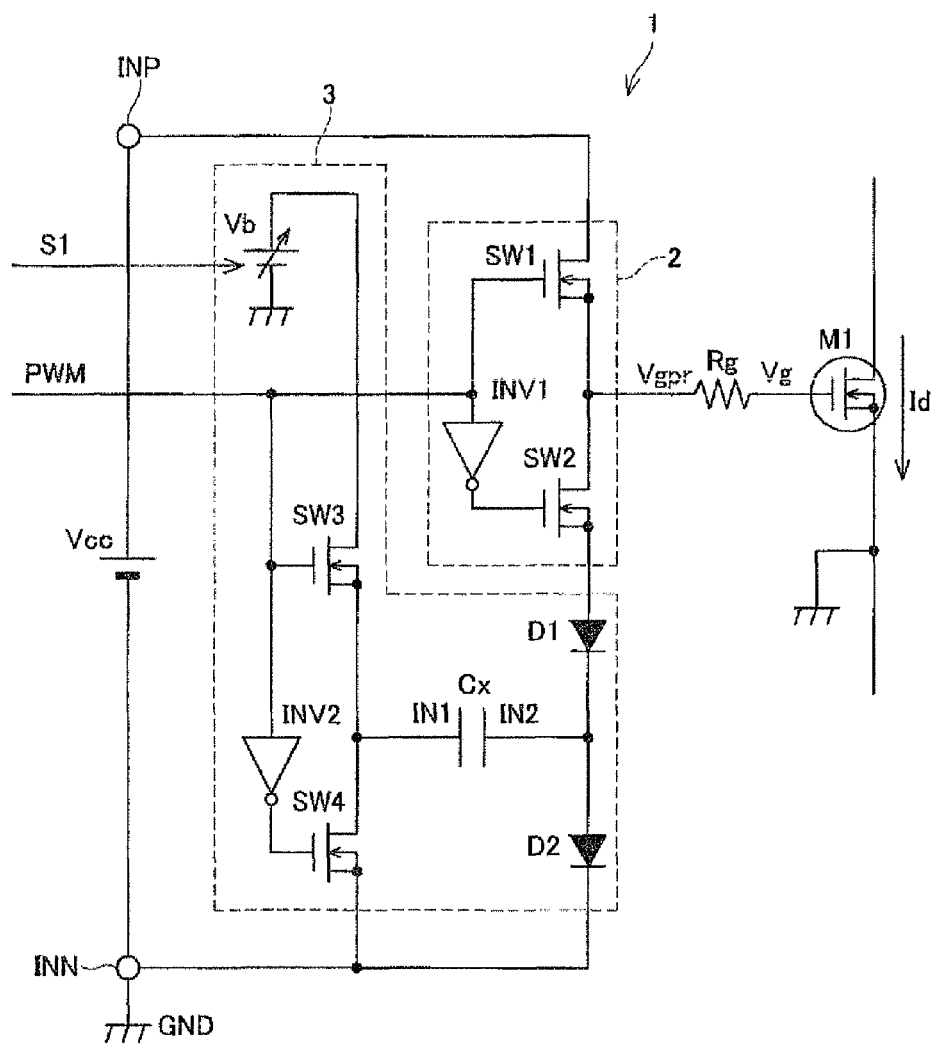
FIG. 1 shows a configuration of a drive circuit according to an embodiment.

The features of the technique disclosed in the present application will be summarized. Each of the features described below independently has technical usefulness.

(First Feature)

An example of a drive circuit for driving a switching device may include a first terminal, a second terminal, a controller, and a charge pump including a capacitor. The first terminal may be configured to be connected with one of polarities of a DC power source. The second terminal may be configured to be connected with another of the polarities of the DC power source. The controller may be configured to connect a gate terminal of the switching device with the first terminal in a first stage, and to connect the gate terminal of the switching device with the second terminal in a second stage. The capacitor of the charge pump may be configured to be charged in the first stage, and to be connected to the gate terminal of the switching device in the second stage. The charge pump may be configured to be able to adjust a charging voltage for the capacitor according to an order signal. This drive circuit is useful when the switching device is turned on as well as when it is turned off.

(Second Feature)

In the drive circuit of the first feature, the capacitor of the charge pump may be configured such that charges charged in the first stage are discharged within the second stage.

(Third Feature)

In the drive circuit of the second feature, the capacitor of the charge pump may be configured such that the charges charged in the first stage are discharged before a mirror period finishes.

(Fourth Feature)

The drive circuit of any one of the first to third features may further include a detector for detecting a driving voltage applied to the gate terminal of the switching device in the second stage. In this case, the order signal may be adjusted so that the driving voltage comes to have a predetermined value.

(Fifth Feature)

The drive circuits of the first to fourth features can provide advantages useful when the switching device is turned off. In this case, the first terminal may be configured to be connected with the positive electrode of the DC power source. Moreover, the second terminal may be configured to be connected with the negative electrode of the DC power source. Here, the capacitor of the charge pump may include a first electrode and a second electrode. The capacitor of the charge pump may be configured such that the capacitor is charged so that a potential of the first electrode becomes higher than that of the second electrode in the first stage (ON-stage), and the first electrode is connected to the second terminal and the second electrode is connected to the gate terminal of the switching device in the second stage (OFF-stage).

(Sixth Feature)

The drive circuits of the first to fourth features can provide advantages useful when the switching device is turned on. In this case, the first terminal may be configured to be connected with the negative electrode of the DC power source. Moreover, the second terminal may be configured to be connected with the positive electrode of the DC power source. Here, the capacitor of the charge pump may include a first electrode and a second electrode. The capacitor of the charge pump may be configured such that the capacitor is charged so that a potential of the first electrode becomes lower than that of the second electrode in the first stage (OFF-stage), and the first electrode is connected to the second terminal and the second electrode is connected to the gate terminal of the switching device in the second stage (ON-stage).

(Seventh Feature)

An example of a drive circuit for driving a switching device may include a positive terminal, a negative terminal, a controller, and a charge pump including a capacitor. The positive terminal maybe configured to be connected with a positive electrode of a DC power source. The negative terminal may be configured to be connected with a negative electrode of the DC power source. The controller may be configured to connect a gate terminal of the switching device with the positive terminal in an ON-stage, and to connect the gate terminal of the switching device with the negative terminal in an OFF-stage. The capacitor of the charge pump may include a first electrode and a second electrode. The capacitor of the charge pump may be configured such that the first electrode is charged so that a potential of the first electrode becomes higher than that of the second electrode in the ON-stage, and the first electrode is connected to the negative terminal and the second electrode is connected to the gate terminal of the switching device in the OFF-stage. The charge pump may be configured to be able to adjust a charging voltage charged in the capacitor according to an order signal.

(Eighth Feature)

In the drive circuit of the seventh feature, the capacitor of the charge pump may be configured such that charges charged in the ON-stage are discharged within the OFF-stage. In the drive circuit of this feature, the switching device is quickly turned off in an initial stage during the OFF-stage, and the switching device is slowly turned off in accordance with the discharging of the charges from the capacitor. Thus, in this drive circuit, it is possible to reduce a switching loss based on the fast turning-off operation and to reduce a surge voltage based on the slow turning-off operation.

(Ninth Feature)

In the drive circuit of the eighth feature, the capacitor of the charge pump may be configured such that the charges charged in the ON-stage are discharged before a mirror period finishes. A surge voltage that occurs across the main switching device often occurs at the end of a mirror period. In the drive circuit of this feature, since charges can be completely discharged from the capacitor before the surge voltage occurs across the main switching device, it is possible to decelerate the turning-off operation and to reliably suppress the surge voltage.

(Tenth Feature)

In the drive circuit of any one of the seventh to ninth features, a timing of connecting the capacitor of the charge pump with the gate terminal of the switching device may be synchronized with a timing of connecting the gate terminal of the switching device with the negative terminal. According to the drive circuit of this feature, it is possible to generate a driving voltage that is lower than that of the negative electrode of the DC power source when the switching device is turned off.

(Eleventh Feature)

The drive circuit of any one of the seventh to tenth features may further include a detector for detecting a driving voltage applied to the gate terminal of the switching device in the OFF-stage. In this case, the order signal may be adjusted so that the driving voltage comes to have a predetermined value. In the drive circuit of this feature, since the charging voltage for the capacitor of the charge pump is feedback controlled using the order signal, the driving voltage is controlled to a predetermined value.

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved drive circuits, as well as methods for using and manufacturing the same.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

EMBODIMENT

FIG. 1 shows a circuit diagram of a drive circuit 1 for driving a main switching device M1 (an example of a switching device described in the claims) that is mounted on an inverter for vehicles. As an example, an n-channel metal oxide semiconductor field effect transistor (MOSFET) is used for the main switching device M1, and a wide bandgap compound semiconductor such as a silicon carbide or a gallium nitride is used as the semiconductor material. The drive circuit 1 causes charges to be charged to or discharged from an insulated gate of the main switching device M1 to increase or decrease a gate voltage Vg so as to control a drain current Id that flows through the main switching device M1.

The drive circuit 1 includes a positive terminal INP, a negative terminal INN, a controller 2, and a charge pump 3. The positive terminal INP is used by being connected with a positive electrode of a DC power source Vcc, and the negative terminal INN is used by being connected with a negative electrode of the DC power source Vcc. In this example, the negative terminal INN is fixed at a ground voltage GND. The controller 2 is configured to switch a driving voltage Vgpr applied to the gate terminal of the main switching device M1 to an ON-driving voltage or an OFF-driving voltage. In this example, the ON-driving voltage is a DC voltage Vcc, and the OFF-driving voltage is a ground voltage GND. The charge pump 3 adjusts the driving voltage Vgpr applied to the gate terminal of the main switching device M1 so as to be lower than the OFF-driving voltage GND in an initial stage during a transition period where the main switching device M1 is turned off.

The controller 2 includes a first switching device SW1, a second switching device SW2, and a first inverter INV1. The charge pump 3 includes a variable power source Vb, a third switching device SW3, a fourth switching device SW4, a second inverter INV2, a capacitor Cx, a first diode D1, and a second diode D2.

In the controller 2, the first and second switching devices SW1 and SW2 are serially connected between the positive terminal INP and the negative terminal INN. The first switching device SW1 is an n-type MOSFET of which the drain is connected to the positive terminal INP and the source is connected to the second switching device SW2. A PWM signal is input to the gate of the first switching device SW1. The second switching device SW2 is an n-channel MOSFET of which the drain is connected to the first switching device SW1 and the source is connected to the anode of the first diode D1. A PWM signal that is inverted by the first inverter INV1 is input to the gate of the second switching device SW2.

A node between the source of the first switching device SW1 and the drain of the second switching device SW2 is connected to a gate resistor Rg of the main switching device M1.

In the charge pump 3, the third and fourth switching devices SW3 and SW4 are serially connected between the variable power source Vb and the negative terminal INN. The third switching device SW3 is an n-channel MOSFET of which the drain is connected to the positive electrode of the variable power source Vb and the source is connected to the fourth switching device SW4. The PWM signal is input to the gate of the third switching device SW3. The fourth switching device SW4 is an n-channel MOSFET of which the drain is connected to the third switching device SW3 and the source is connected to the negative terminal INN. A PWM signal that is inverted by the second inverter INV2 is input to the gate of the fourth switching device SW4. A node between the source of the third switching device SW3 and the drain of the fourth switching device SW4 is connected to a first electrode NI of the capacitor.

Moreover, in the charge pump 3, the first and second diodes D1 and D2 are serially connected between the positive terminal INP and the negative terminal INN. The first diode D1 has an anode connected to the source of the second switching device SW2 and a cathode connected to the second diode D2. The second diode has an anode connected to the first diode D1 and a cathode connected to the negative terminal INN. A node between the cathode of the first diode D1 and the anode of the second diode D2 is connected to a second electrode IN2 of the capacitor Cx.

Figure 2A:
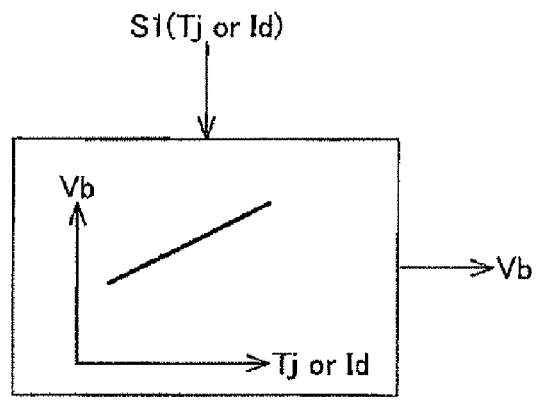
FIG. 2A shows an example of the relation between an input and an output of a variable power source.
Figure 2B:
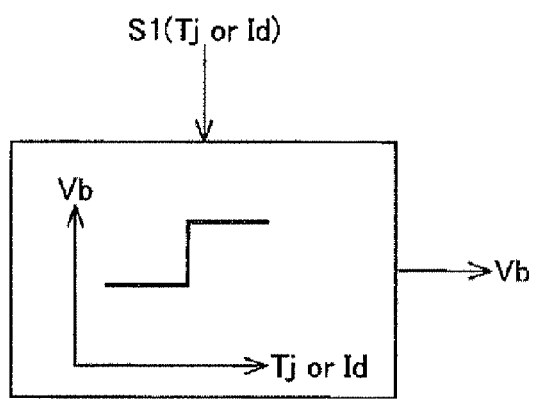
FIG. 2B shows another example of the relation between the input and the output of the variable power source.
Figure 2C:
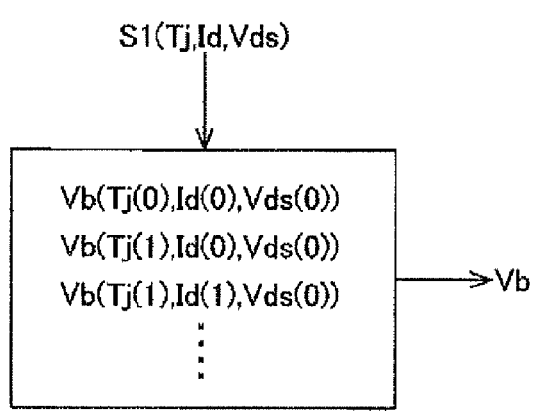
FIG. 2C shows another example of the relation between the input and the output of the variable power source.

The variable power source Vb is configured to receive an order signal S1 from an external device. The variable power source Vb outputs a control voltage Vb that is varied according to the order signal S1. Examples of the relation between the order signal S1 input to the variable power source Vb and the control voltage Vb output from the variable power source Vb are shown in FIGS. 2A to 2C. As shown in FIGS. 2A and 2B, the order signal S1 input to the variable power source Vb may be a temperature Tj of the main switching device M1 or the drain current Id. In the example of FIG. 2A, the variable power source Vb outputs the control voltage Vb that monotonously follows a variation of the temperature Tj or the drain current Id of the main switching device M1. Specifically, the variable power source Vb outputs the control voltage Vb that increases monotonously with the increase in the temperature Tj or the drain current Id of the main switching device M1. In the example of FIG. 2B, the variable power source Vb outputs a plurality of discrete control voltages Vb in accordance with a plurality of predetermined ranges of the temperature Tj or the drain current Id of the main switching device M1. Specifically, the variable power source Vb outputs a relatively high control voltage Vb when the temperature Tj of the main switching device M1 is relatively high or the drain current Id is relatively large. Alternatively, as shown in FIG. 2C, the order signal S1 input to the variable power source Vb may be the temperature Tj of the main switching device M1, the drain current Id, and a drain-source voltage Vds. In the example of FIG. 2C, the variable power source Vb outputs a table-controlled control voltage Vb in accordance with the temperature Tj of the main switching device M1, the drain current Id, and the drain-source voltage Vds.

Figure 4:
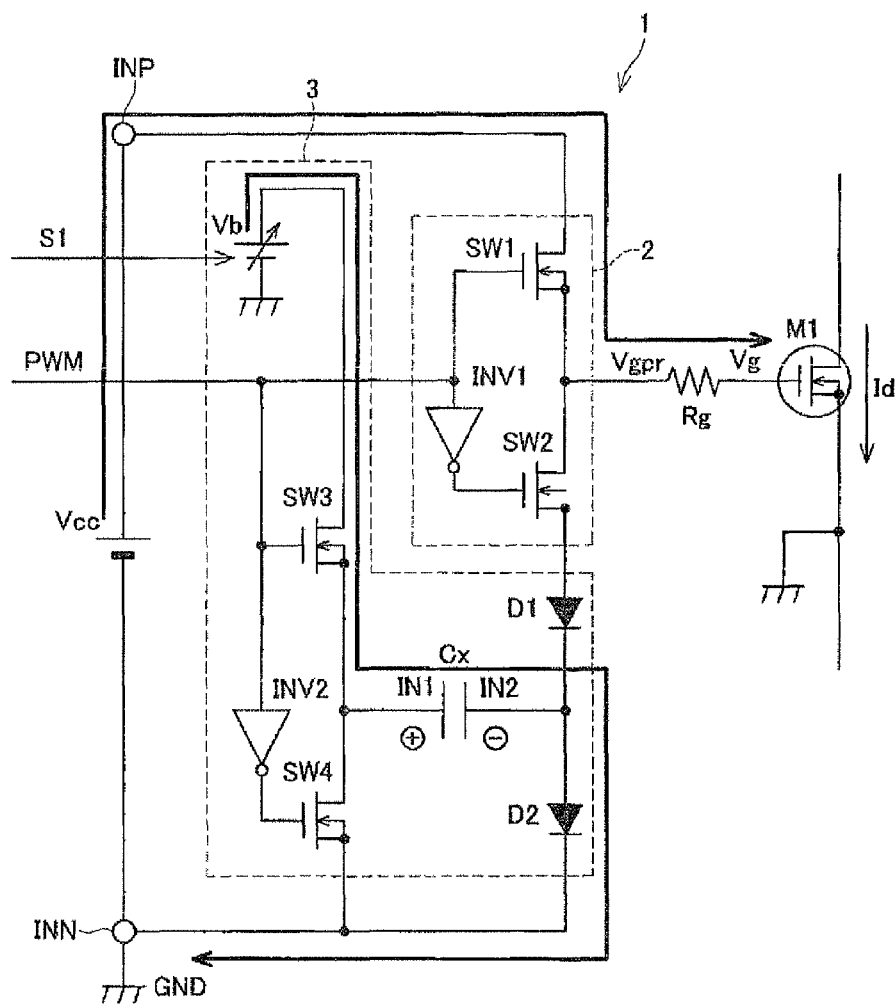
FIG. 4 shows a conduction state in an initial stage during an ON-stage of the drive circuit according to the embodiment.
Figure 5:
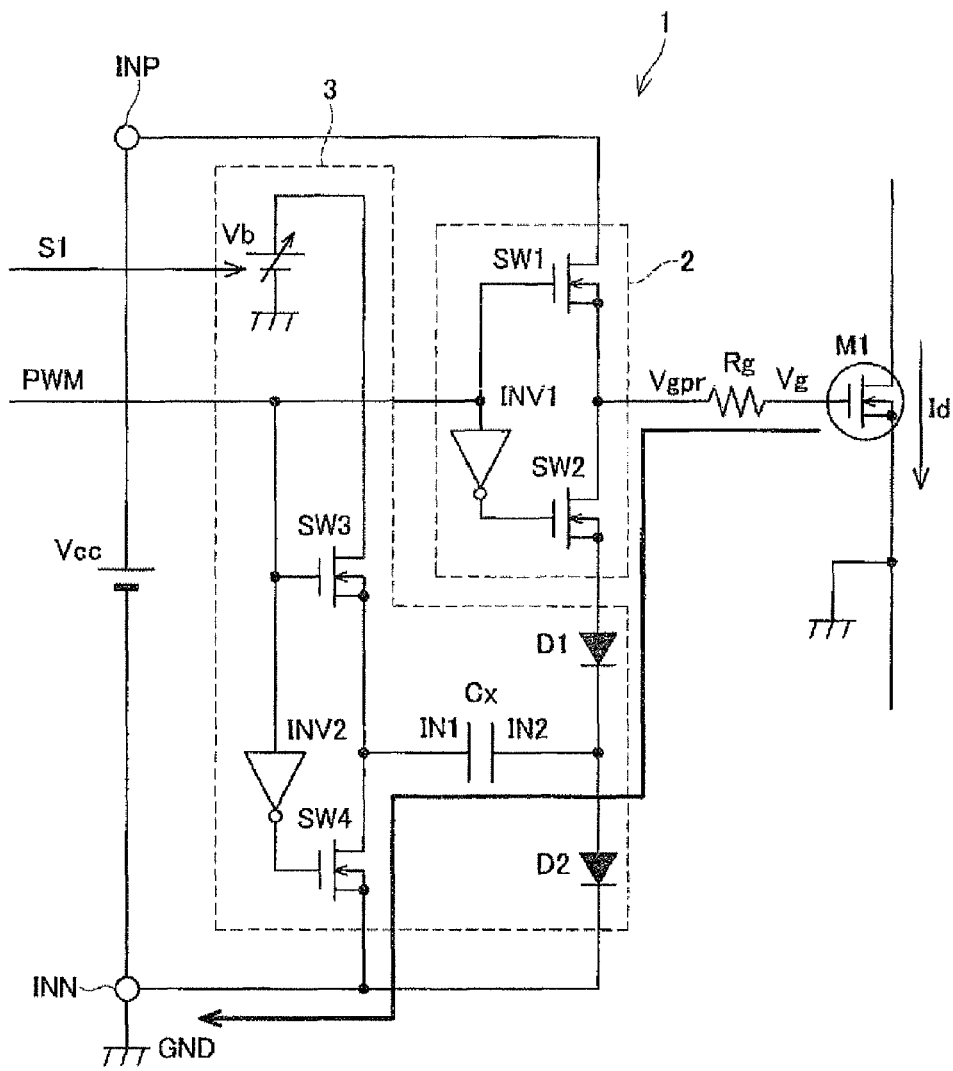
FIG. 5 shows a conduction state in an initial stage during an OFF-stage of the drive circuit according to the embodiment.
Figure 6:
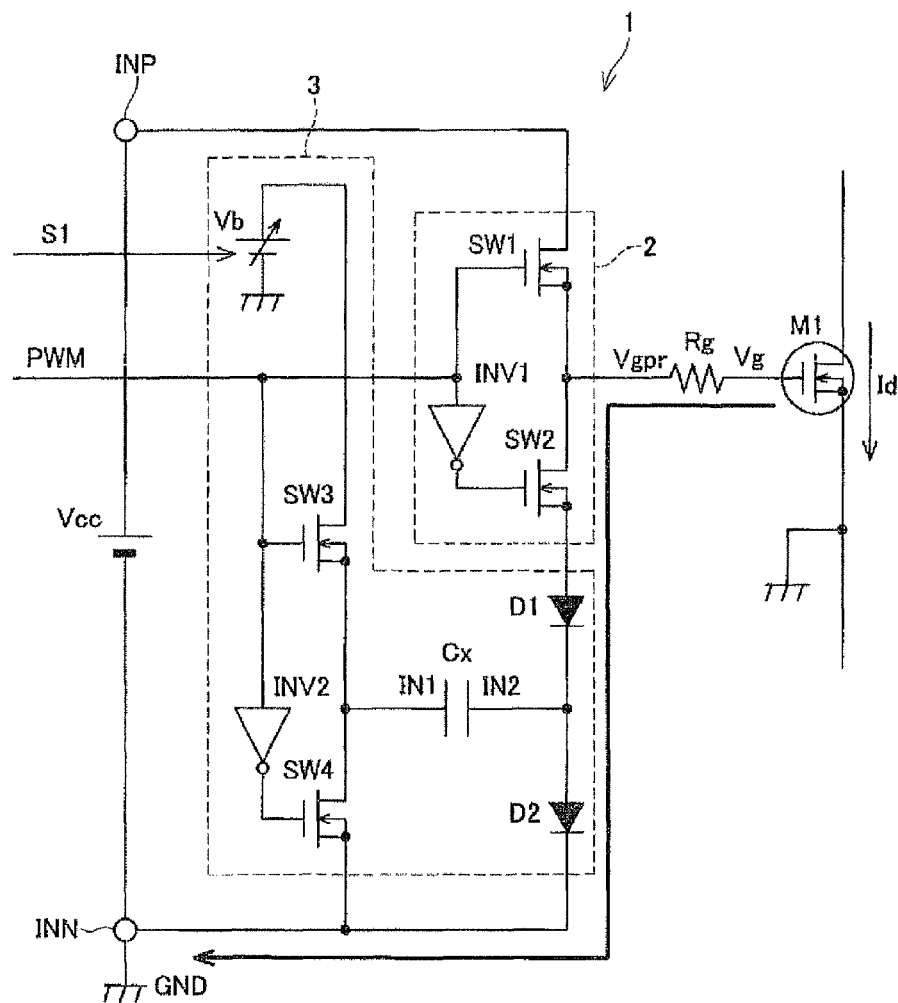
FIG. 6 shows a conduction state after the end of the initial stage during the OFF-stage of the drive circuit according to the embodiment.

Next, the operation of the drive circuit 1 will be described with reference to the time chart of FIG. 3 and the modes shown in FIGS. 4 to 6.

Figure 3:
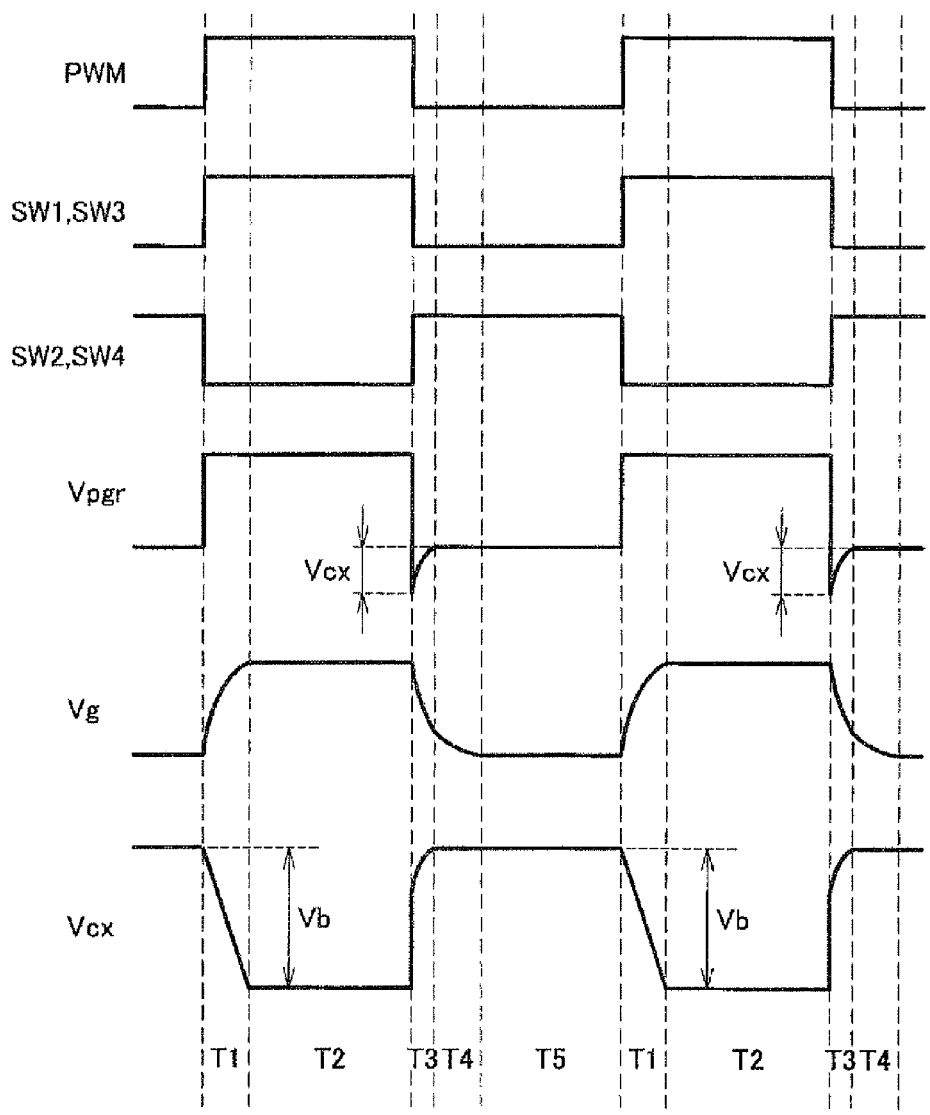
FIG. 3 shows a time chart showing the respective constituent components and voltages of the drive circuit according to the embodiment.

As shown in FIG. 3, when the PWM signal is HIGH, the first and third switching devices SW1 and SW3 are turned on, and the second and fourth switching devices SW2 and SW4 are turned off. As shown in FIG. 4, when the first switching device SW1 is turned on, the positive terminal INP and the insulated gate of the main switching device M1 are connected. As a result, the driving voltage Vgpr applied to the gate resistor Rg of the main switching device M1 becomes approximately the ON-driving voltage Vcc. Thus, as indicated by period T1 in FIG. 3, the gate voltage Vg of the main switching device M1 rises, and the main switching device M1 is turned on.

Moreover, the variable power source Vb of the charge pump 3 outputs the control voltage Vb according to the order signal S1. As shown in FIG. 4, when the third switching device SW3 is turned on, the capacitor Cx is connected between the variable power source Vb and the negative terminal INN. The capacitor Cx is charged so that a potential of the first electrode IN1 is higher than that of the second electrode IN2. Due to this operation, the charging voltage Vex of the capacitor Cx is charged to approximately the control voltage Vb. Thus, as indicated by period T1 of FIG. 3, as for the charging voltage Vex of the capacitor Cx, the voltage of the second electrode IN2 falls in relation to the voltage of the first electrode IN1. When a turn-ON transition period finishes, as indicated by period T2 of FIG. 3, normal ON-driving is performed until the PWM signal falls.

As shown in FIG. 3, when the PWM signal becomes LOW, the first and third switching devices SW1 and SW3 are turned off, and the second and fourth switching devices SW2 and SW4 are turned on. As shown in FIG. 5, when the second and fourth switching devices SW2 and SW4 are turned on, the capacitor Cx is connected between the insulated gate of the main switching device M1 and the negative terminal INN. Specifically, the first electrode IN1 of the capacitor Cx is connected to the negative terminal INN, and the second electrode IN2 is connected to the insulated gate of the main switching device M1. As a result, as indicated by period T3 of FIG. 3, the driving voltage Vgpr applied to the gate resistor Rg of the main switching device M1 becomes approximately −Vex since the charging voltage Vex of the capacitor Cx is added to the OFF-driving voltage GND. Thus, since a state in which a negative bias were applied to the main switching device M1 is created, the discharging rate of the charges discharged from the insulated gate of the main switching device M1 increases, and the main switching device M1 is quickly turned off.

In the drive circuit 1, the capacity of the capacitor Cx is set so that the amount of charges stored in the capacitor Cx in the OFF-stage is smaller than the amount of charges stored in a gate input capacitance of the main switching device M1 when the main switching device M1 is turned on. Specifically, the capacity of the capacitor Cx is set to be smaller than the gate input capacitance of the main switching device M1. Thus, in the drive circuit 1, all charges stored in the capacitor Cx are discharged before the mirror period finishes. As shown in FIG. 6, when all charges of the capacitor Cx are discharged, the insulated gate of the main switching device M1 and the negative terminal INN are connected through the diodes D1 and D2. Thus, after all charges of the capacitor Cx are discharged, approximately the OFF-driving voltage GND is applied to the insulated gate of the main switching device M1. As indicated by period T4 of FIG. 3, when the voltage applied to the insulated gate of the main switching device M1 becomes the OFF-driving voltage GND, the discharging rate of the charges discharged from the insulated gate of the main switching device M1 decreases, and the main switching device M1 is slowly turned off When a turn-OFF transition period finishes, as indicated by period T5 of FIG. 3, normal OFF-driving is performed until the PWM signal is raised.

Hereinafter, the features of the drive circuit 1 will be summarized.

(1) The drive circuit 1 has such a feature that the variable power source Vb is configured to be capable of independently adjusting the charging voltage charged to the capacitor Cx according to the order signal S1. Thus, it is also possible to independently adjust the driving voltage Vgpr in the initial stage of the transition period where the main switching device M1 is turned off. The drive circuit 1 can flexibly control the driving voltage Vgpr in the initial stage of the transition period where the main switching device M1 is turned off using the order signal S1.

(2) In the main switching device M1 driven by the drive circuit 1, the falling speed of the gate voltage Vg is relatively accelerated using the relatively low driving voltage Vgpr (substantially negative bias) in the first half stage of the turn-OFF transition period, and the falling speed of the gate voltage Vg is relatively decelerated using the relatively high driving voltage Vgpr (ground voltage) in the second half stage of the turn-OFF transition period. The falling speed of the gate voltage Vg in the second half stage of the turn-OFF transition period has a great influence on a surge in the drain-source voltage of the main switching device M1. Since the use of the drive circuit 1 enables the falling speed of the gate voltage Vg in the second half stage of the turn-OFF transition period to be decelerated, a surge in the drain-source voltage when the main switching device M1 is turned off is suppressed. On the other hand, since the falling speed of the gate voltage Vg in the first half stage of the turn-OFF transition period is accelerated, an increase in the switching loss is suppressed.

(3) In general, the properties of the main switching device M1 are not even but various variations occur. For example, the main switching device M1 entails a variation in the input capacitance of the insulated gate, a variation in temperature properties, and other variations. Moreover, the properties of the charge pump 3 are not even but various variations occur. For example, the charge pump 3 entails a variation in the capacitance of the capacitor Cx, a variation in temperature properties, and other variations. In the drive circuit 1, as shown in FIGS. 2A to 2C, the temperature Tj of the main switching device M1, the drain current Id, and the drain-source voltage Vds can be used as the order signal S1. These items of information reflect the variations of the main switching device M1. Thus, by allowing the variable power source Vb to control the control voltage Vb according to the order signal S1, it is possible to generate the driving voltage Vgpr that is appropriately adjusted based on the variations of the main switching device M1. For example, in order to suppress the switching speed from decreasing abnormally when a threshold voltage of the gate terminal of the main switching device M1 decreases with an increase in the temperature Tj of the main switching device M1, it is possible to increase the control voltage Vb output from the variable power source Vb and to decrease the driving voltage Vgpr to increase the switching speed of the main switching device M1. Moreover, in order to suppress an increase in the switching loss due to an increase in a recovery current, resulting from an increase in the drain current Id of the main switching device M1, it is possible to increase the control voltage Vb output from the variable power source Vb and to decrease the driving voltage Vgpr to suppress an increase in the switching loss of the main switching device M1. In this manner, the drive circuit 10 can compensate for the variations of the main switching device M1 and the like by controlling the driving voltage Vgpr using the order signal S1.

(4) A wide bandgap compound semiconductor such as a silicon carbide or a gallium nitride is used as the semiconductor material of the main switching device M1. The main switching device M1 formed from such a wide bandgap compound semiconductor allows fast switching operations but has a problem in that timing control for active gate driving is difficult. In the drive circuit 1 of the present embodiment, since the driving voltage Vgpr is switched according to the discharging of the capacitor Cx, a special timing control circuit is not required. Thus, the drive circuit 1 is particularly useful for driving the main switching device M1 formed from a wide bandgap compound semiconductor.

Figure 7:
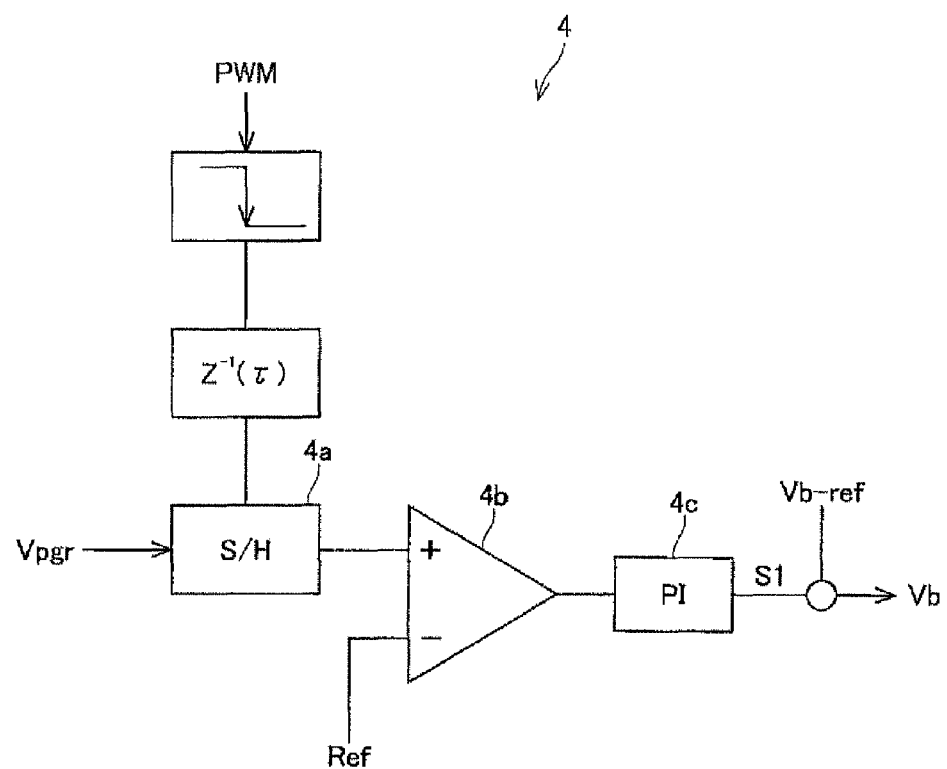
FIG. 7 shows an overview of the configuration of a detector provided in the drive circuit according to the embodiment.

(5) FIGS. 2A to 2C show examples in which the control voltage Vb of the variable power source Vb is controlled based on the parameters of the temperature Tj, the drain current Id, and the drain-source voltage Vds. Instead of these examples, an ON-driving voltage may be used as the parameter. As shown in FIG. 7, the detector 4 includes a sampling and holding unit 4a, an error amplifier 4b, and a PI controller 4c. The sampling and holding unit 4a samples and holds the OFF-driving voltage Vgpr after the elapse of a predetermined period from the falling edge of the PWM signal. For example, in the example of FIG. 3, the sampling and holding unit 4a samples and holds the OFF-driving voltage Vgpr in period T5. The error amplifier 4b compares the sampled-and-held OFF-driving voltage Vgpr with a target voltage (as an example, the ground voltage GND), amplifies a shift from the target voltage, and outputs the amplified error. The PI controller 4c generates the order signal S1 for determining a variable width in the variable power source Vb according to the output of the error amplifier 4b.

For example, when the gate input capacitance of the main switching device M1 and/or the capacitance of the capacitor Cx deviate from a desired value due to element variations so that the input charge amount of the main switching device M1 becomes smaller than the amount of charges charged in the capacitor Cx, the charges charged in the capacitor Cx are not completely discharged in the OFF-stage, and a negative bias voltage corresponding to the remaining charges appears in the OFF-driving voltage Vgpr of the main switching device M1. In such a case, since the voltage rises from the negative bias voltage when the main switching device M1 is turned on, the time required for turning-ON increases, and the switching loss increases.

As shown in FIG. 7, when the detector 4 is used, the charging voltage charged to the capacitor Cx of the charge pump 3 is feedback controlled, and the OFF-driving voltage Vgpr can be controlled to a target value. In this manner, the aforementioned situation is obviated even when element variations occur.

(6) In the above embodiment, the drive circuit 1 useful when the main switching device M1 is turned off has been described as an example. Based on the same technical ideas, it is possible to provide a drive circuit useful when the main switching device M1 is turned on. In this case, the capacitor is configured such that charges are stored in the OFF-stage of the main switching device M1, and the capacitor is connected to the insulated gate of the main switching device M1 when the main switching device M1 is turned on. More specifically, in the OFF-stage of the main switching device M1, one electrode of the capacitor is charged to a potential lower than that of the other electrode. Further, the capacitor is configured such that when the main switching device M1 is turned on, one electrode is connected to the positive terminal INP and the other electrode is connected to the insulated gate of the main switching device M1. In this manner, in the initial stage of the transition period where the main switching device M1 is turned on, a driving voltage in which the charging voltage of the capacitor is superimposed on the DC voltage Vcc is applied, and the turning-ON operation is accelerated.

What is claimed is:

1. A drive circuit for driving a switching device, the drive circuit comprising:
   a first terminal, a second terminal, a controller, and a charge pump including a capacitor, wherein
   the first terminal is configured to be connected with one of polarities of a DC power source,
   the second terminal is configured to be connected with another of the polarities of the DC power source,
   the controller is configured to connect a gate terminal of the switching device with the first terminal in a first stage, and to connect the gate terminal of the switching device with the second terminal in a second stage,
   the capacitor of the charge pump is configured to be charged in the first stage, and to be connected to the gate terminal of the switching device in the second stage, and
   the charge pump is configured to be able to adjust a charging voltage charged in the capacitor to different magnitudes according to an order signal.

2. The drive circuit according to claim 1, wherein the capacitor of the charge pump is configured such that charges charged in the first stage are discharged within the second stage.

3. The drive circuit according to claim 2, wherein the capacitor of the charge pump is configured such that the charges charged in the first stage are discharged before a mirror period finishes.

4. The drive circuit according to claim 1, wherein a timing of connecting the capacitor of the charge pump with the gate terminal of the switching device is synchronized with a timing of connecting the gate terminal of the switching device with the second terminal.

5. The drive circuit according to claim 1, further comprising:
   a detector for detecting a driving voltage applied to the gate terminal of the switching device in the second stage, wherein
   the order signal is adjusted so that the driving voltage comes to have a predetermined value.

6. The drive circuit according to claim 1, wherein the order signal is based on a temperature of the switching device, a current passing though the switching device, or a combination thereof.

7. A drive circuit for driving a switching device, the drive circuit comprising:
   a positive terminal, a negative terminal, a controller, and a charge pump including a capacitor, wherein
   the positive terminal is configured to be connected with a positive electrode of a DC power source,
   the negative terminal is configured to be connected with a negative electrode of the DC power source,
   the controller is configured to connect a gate terminal of the switching device with the positive terminal in an ON-stage, and to connect the gate terminal of the switching device with the negative terminal in an OFF-stage,
   the capacitor of the charge pump includes a first electrode and a second electrode,
   the capacitor of the charge pump is configured such that the capacitor is charged so that a potential of the first electrode becomes higher than that of the second electrode in the ON-stage, and the first electrode is connected to the negative terminal and the second electrode is connected to the gate terminal of the switching device in the OFF-stage, and the charge pump is configured to be able to adjust a charging voltage charged in the capacitor to different magnitudes according to an order signal.

8. The drive circuit according to claim 7, wherein
the capacitor of the charge pump is configured such that charges charged in the ON-stage are discharged within the OFF-stage.

9. The drive circuit according to claim 8, wherein
the capacitor of the charge pump is configured such that the charges charged in the ON-stage are discharged before a mirror period finishes.

10. The drive circuit according to claim 7, wherein
a timing of connecting the capacitor of the charge pump with the gate terminal of the switching device is synchronized with a timing of connecting the gate terminal of the switching device with the negative terminal.

11. The drive circuit according to claim 7, further comprising,
a detector for detecting a driving voltage applied to the gate terminal of the switching device in the OFF-stage, wherein
the order signal is adjusted so that the driving voltage comes to have a predetermined value.

12. The drive circuit according to claim 7, wherein
the order signal is based on a temperature of the switching device, a current passing though the switching device, or a combination thereof.

* * * * *